(12) United States Patent
Kang

(10) Patent No.: US 10,199,534 B2
(45) Date of Patent: Feb. 5, 2019

(54) LIGHT-EMITTING DIODE, LIGHT-EMITTING DIODE PACKAGE, AND LIGHTING SYSTEM INCLUDING SAME

(71) Applicant: LG INNOTEK CO., LTD., Seoul (KR)

(72) Inventor: Hyun Oh Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/557,019

(22) PCT Filed: Mar. 11, 2016

(86) PCT No.: PCT/KR2016/002460
§ 371 (c)(1),
(2) Date: Sep. 8, 2017

(87) PCT Pub. No.: WO2016/144135
PCT Pub. Date: Sep. 15, 2016

(65) Prior Publication Data
US 2018/0062028 A1 Mar. 1, 2018

(30) Foreign Application Priority Data
Mar. 11, 2015 (KR) .................. 10-2015-0033527

(51) Int. Cl.
*H01L 33/02* (2010.01)
*H01L 33/06* (2010.01)
(Continued)

(52) U.S. Cl.
CPC ............ *H01L 33/025* (2013.01); *F21K 9/232* (2016.08); *F21K 9/235* (2016.08); *F21K 9/237* (2016.08);
(Continued)

(58) Field of Classification Search
CPC ....... H01L 33/025; H01L 33/06; H01L 33/32; H01L 33/486; F21V 3/02; F21V 29/80;
(Continued)

(56) References Cited

U.S. PATENT DOCUMENTS 7,667,225 B1    2/2010 Lee et al.
2004/0256611 A1 12/2004 Kim et al.
(Continued)

FOREIGN PATENT DOCUMENTS

KR  10-2005-0073740   7/2005
KR  10-2006-0046155   5/2006
(Continued)

OTHER PUBLICATIONS

International Search Report (with English Translation) and Written Opinion dated Jun. 27, 2016 issued in Application No. PCT/KR2016/002460.

*Primary Examiner* — Peniel M Gumedzoe
(74) *Attorney, Agent, or Firm* — KED & Associates, LLP

(57) ABSTRACT

A light emitting diode according to an embodiment includes: a substrate; a first conductive semiconductor layer on the substrate; an active layer on the first conductive semiconductor layer; and a light emitting structure including a second conductive semiconductor layer on the active layer, wherein the active layer includes at least one quantum well layer and at least one quantum barrier layer, and each of the quantum well layers includes a plurality of well layers having different indium composition ratios, thereby improving internal quantum efficiency.

20 Claims, 11 Drawing Sheets

(51) Int. Cl.
*H01L 33/32* (2010.01)
*F21V 3/02* (2006.01)
*F21V 29/80* (2015.01)
*F21K 9/232* (2016.01)
*F21K 9/238* (2016.01)
*F21K 9/235* (2016.01)
*F21K 9/237* (2016.01)
*F21Y 115/10* (2016.01)
*H01L 33/48* (2010.01)
*H01L 33/50* (2010.01)
*H01L 33/60* (2010.01)
*H01L 33/62* (2010.01)
*H01L 33/64* (2010.01)

(52) U.S. Cl.
CPC ............... *F21K 9/238* (2016.08); *F21V 3/02* (2013.01); *F21V 29/80* (2015.01); *H01L 33/06* (2013.01); *H01L 33/32* (2013.01); *F21Y 2115/10* (2016.08); *H01L 33/486* (2013.01); *H01L 33/502* (2013.01); *H01L 33/60* (2013.01); *H01L 33/62* (2013.01); *H01L 33/647* (2013.01); *H01L 2224/48091* (2013.01); *H01L 2924/181* (2013.01)

(58) Field of Classification Search
CPC .......... F21K 9/232; F21K 9/238; F21K 9/235; F21K 9/237
See application file for complete search history.

(56) References Cited

U.S. PATENT DOCUMENTS

| | | |
|---|---|---|
| 2005/0152420 A1 | 7/2005 | Kim |
| 2006/0081832 A1 | 4/2006 | Chen |
| 2011/0188528 A1 | 8/2011 | Kisin et al. |
| 2012/0319079 A1* | 12/2012 | Han ..................... H01L 33/06 257/13 |
| 2013/0020553 A1 | 1/2013 | Han et al. |

FOREIGN PATENT DOCUMENTS

| | | |
|---|---|---|
| KR | 10-0931483 | 12/2009 |
| KR | 10-2013-0038050 | 4/2013 |
| KR | 10-2013-0011918 | 11/2013 |

* cited by examiner

114a (a)

114b (b)

(a)

(b)

(a)

(b)

(a)

(b)

(a)

(b)

LIGHT-EMITTING DIODE, LIGHT-EMITTING DIODE PACKAGE, AND LIGHTING SYSTEM INCLUDING SAME

CROSS-REFERENCE TO RELATED PATENT APPLICATIONS

This application is a U.S. National Stage Application under 35 U.S.C. § 371 of PCT Application No. PCT/KR2016/002460, filed Mar. 11, 2016, which claims priority to Korean Patent Application No. 10-2015-0033527, filed Mar. 11, 2015, whose entire disclosures are hereby incorporated by reference.

TECHNICAL FIELD

An embodiment relates to a light emitting diode, a light emitting diode package, and a lighting system including the same.

BACKGROUND ART

A light emitting diode (LED) is a p-n junction diode having characteristics of converting electric energy into light energy, may be configured with a compound semiconductor of Group III and Group V elements or the like of the periodic table and may represent various colors by adjusting a composition ratio of a compound semiconductor.

When a forward voltage is applied to the light emitting diode, electrons of n layer and holes of p layer are coupled and emit energy corresponding to an energy gap between a conduction band and a valance band. When the energy is converted to light, the light emitting diode emits the light.

Nitride semiconductors are attracting a great attention in the development fields of optical devices and high power electronic devices due to high thermal stability and wide band-gap energy thereof. In particular, blue light emitting diodes, green light emitting diodes, and ultraviolet (UV) light emitting diodes using the nitride semiconductors are commercially available and widely used.

Meanwhile, a carrier over-shooting occurs in an active layer where the electrons of the n layer and the holes of the p layer are coupled to each other, which may have an influence on a decrease in internal quantum efficiency.

The carrier over-shooting or a carrier overflight means that the energy of the electrons to be injected into the active layer is high and is not injected into a quantum well, and thus the internal quantum efficiency may be reduced.

In order to capture more carriers in the active layer and to prevent the carrier over-shooting, a new structure capable of improving the internal quantum efficiency is required to be developed.

DISCLOSURE

Technical Problem

An embodiment provides a light emitting diode, a light emitting diode package, and a lighting system, including a well layer of a new structure capable of capturing more carriers in an active layer to improve internal quantum efficiency.

Technical Solution

A light emitting diode according to an embodiment includes a substrate, a first conductive semiconductor layer on the substrate, an active layer on the first conductive semiconductor layer, and a light emitting structure including a second conductive semiconductor layer on the active layer, wherein the active layer includes at least one quantum well layer and at least one quantum barrier layer, and each of the quantum well layers includes a plurality of well layers having different indium composition ratios, thereby improving internal quantum efficiency.

A light emitting diode according to an embodiment includes a substrate, a first conductive semiconductor layer on the substrate, an active layer on the first conductive semiconductor layer, and a light emitting structure including a second conductive semiconductor layer on the active layer, wherein the active layer includes at least one well layer and at least one barrier layer, wherein the well layer includes a first well layer, a second well layer, and a third well layer having different indium composition ratios, wherein a width of the well layer may be 3.0 nm or more and 3.5 nm or less, a width of the barrier layer may be 4.5 nm or more and 5.5 nm or less, and a width of the first well layer may be 0.6 nm or more and 0.7 nm or less.

Advantageous Effects

In an embodiment, more carriers may be captured in an active layer, thereby improving internal quantum efficiency.

Also, in the embodiment, a plurality of well layers having different indium composition ratios in the active layer is provided, thereby minimizing carrier over-shooting.

MODES OF THE INVENTION

Figure 1:
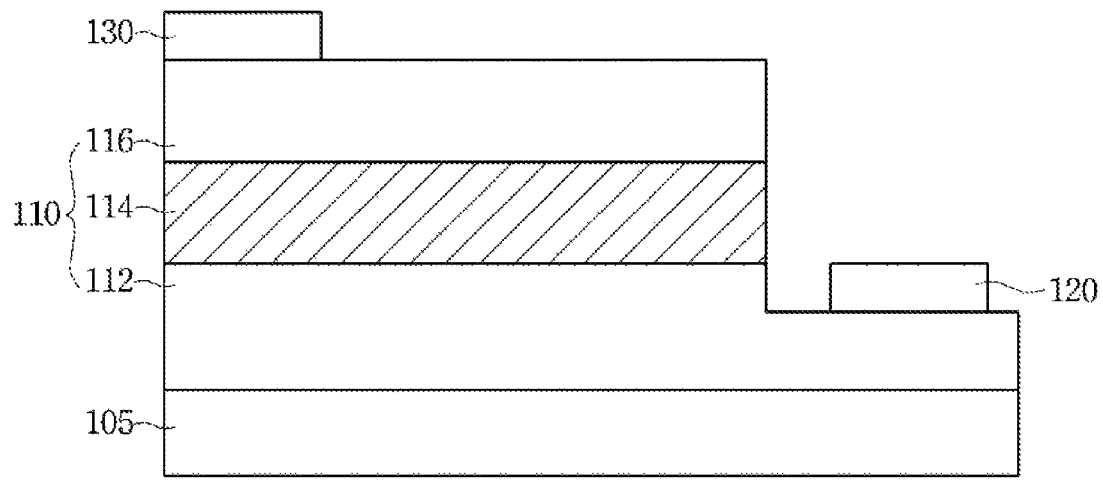
FIG. 1 is a cross-sectional view of a light emitting diode according to an embodiment.

In the description of embodiments, it will be understood that when a layer (or film), region, pattern or structure is referred to as being "on/over" or "under" another layer (or film), region, pattern or structure, the terminology of "on/over" and "under" includes both the meanings of "directly" or "by interposing another layer (indirectly)". Further, the reference about "on/over" and "under" each layer will be made on the basis of drawings.

Thicknesses of layers and areas in the drawings may be exaggerated, omitted, or schematically described for a convenient and precise description. In addition, the size of each component does not fully match the actual size thereof.

Figure 2:
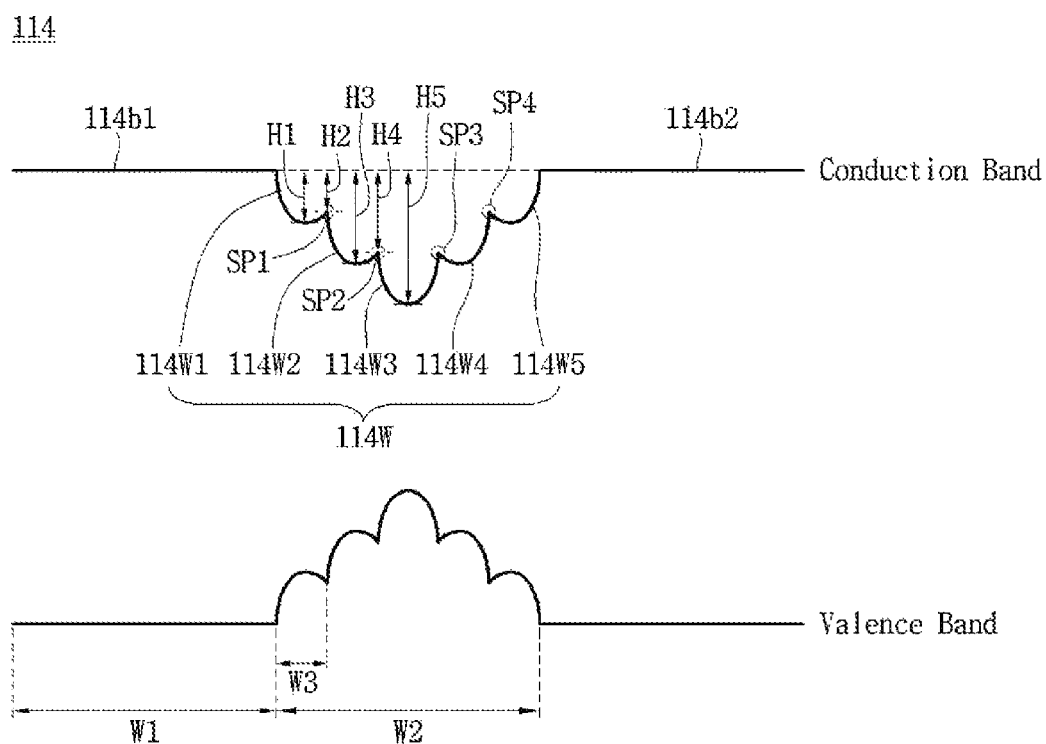
FIG. 2 is an energy-band diagram of an active layer in the light emitting diode of FIG. 1.

FIG. 1 is a cross-sectional view of a light emitting diode according to an embodiment, and FIG. 2 is an energy-band diagram of an active layer in the light emitting diode of FIG. 1.

Referring to FIGS. 1 and 2, the light emitting diode according to the embodiment may include: a substrate 105, a first conductive semiconductor layer 112 on the substrate 105, an active layer 114 on the first conductive semiconductor layer 112, a light emitting structure 110 including a second conductive semiconductor layer 116 on the active layer 114, a first electrode 120 on a partial region of the first conductive semiconductor layer 112, and a second electrode 130 on the second conductive semiconductor layer.

The active layer 114 may be disposed on the first conductive semiconductor layer 112, and the active layer 114 may be a layer which emits light by a band gap difference of an energy band according to a material forming the active layer 114 when electrons (or holes) injected into the first conductive semiconductor layer 112 combine with holes (or electrons) injected into the second conductive semiconductor layer 116. The active layer 114 may be formed of any one of a single-well structure, a multi-well structure, a quantum-dot structure, or a quantum-wire structure, but the present invention is not limited thereto.

A well layer/barrier layer of the active layer 114 may be formed with one or more pair structures among InGaN/GaN, InGaN/InGaN, GaN/AlGaN, InAlGaN/GaN, GaAs(In-GaAs)/AlGaAs, and GaP(InGaP)/AlGaP, but the present invention is not limited thereto. The well layer may be formed of a substance having a lower band gap than that of the barrier layer.

The active layer 114 may include a first quantum barrier layer 114B1, a quantum well layer 114W on the first quantum barrier layer 114B1, and a second quantum barrier layer 114B2 on the quantum well layer 114W.

The quantum well layer 114W may include a first well layer 114W1, a second well layer 114W2 on the first well layer, a third well layer 114W3 on the second well layer 114W2, a fourth well layer 114W4 on the third well layer 114W3, and a fifth well layer 114W5 on the fourth well layer 114W4, all of which have a different indium composition ratio from one another.

The quantum well layer 114W may include a first protrusion part SP1 between the first well layer 114W1 and the second well layer 114W2, a second protrusion part SP2 between the second well layer 114W2 and the third well layer 114W3, a third protrusion part SP3 between the third well layer 114W3 and the fourth well layer 114W4, and a fourth protrusion part SP4 between the fourth well layer 114W4 and the fifth well layer 114W5.

That is, in the light emitting diode according to the embodiment, the energy of electrons moving from the first quantum barrier layer 114B1 to the second quantum barrier layer 114B2 may be reduced by a well layer 114W having a plurality of protrusion parts and a plurality of well layers with different indium composition ratios, and thus carrier over-shooting through the well layer 114W may be prevented. In particular, the well layer 114W may reduce the energy of electrons by disposing a plurality of protrusion parts.

In an embodiment if the first well layer 114W1 is $In_xGa_{1-x}N$ (where, $0 \le x \le 1$), the second well layer is $In_yGa_{1-y}N$ (where, $0 \le y \le 1$), and the third well layer is $In_zGa_{1-z}N$ (where, $0 \le z \le 1$), an indium composition ratio X of the first well layer 114W1 may be smaller than an indium composition ratio Y of the second well layer 114W2, and the indium composition ratio Y of the second well layer 114W2 may be smaller than an indium composition ratio Z of the third well layer 114W3.

In the embodiment, the indium composition ratio X at the center of the first well layer 114W1 may be 0.06 or more and 0.065 or less, the indium composition ratio Y at the center of the second well layer 114W2 may be 0.12 or more and 0.13 or less, and the indium composition ratio Z at the center of the third well layer 114W3 may be 0.17 or more and 0.19 or less, but the present invention is not limited thereto. For example, if the indium composition ratio X at the center of the first well layer 114W1 is less than 0.06 or exceeds 0.065, the indium composition ratio Y at the center of the second well layer 114W2 is less than 0.12 or exceeds 0.13, and the indium composition ratio Z at the center of the third well layer 114W3 is less than 0.17 or exceeds 0.19, the luminous intensity may be lowered.

In the embodiment, the first protrusion part SP1 is $In_qGa_{1-q}N$ (where, $0 \le q \le 1$), an indium composition ratio Q of the first protrusion part SP1 may be 0.03 or more and 0.05 or less, the second protrusion part SP2 is $In_wGa_{1-w}N$ (where, $0 \le w \le 1$), and an indium composition ratio W of the second protrusion part SP2 may be 0.09 or more and 0.11 or less, but the present invention is not limited thereto. For example, if the indium composition ratio Q of the first protrusion part SP1 is less than 0.03, and the indium composition ratio W of the second protrusion part SP2 is less than 0.09, an operating voltage may rise, and if the indium composition ratio Q of the first protrusion part SP1 is more than 0.05 and the indium composition ratio W of the second protrusion part SP2 is more than 0.11, carrier-trap efficiency may be lowered.

The first protrusion part SP1 and the fourth protrusion part SP4 may have the same indium composition ratio and band-gap energy, and the second protrusion part SP2 and the third protrusion part SP3 may have the same indium composition ratio and band-gap energy, but the present invention is not limited thereto.

The band-gap energy of the first well layer 114W1 may be greater than that of the second well layer 114W2, and the band-gap energy of the second well layer 114W2 may be greater than that of the third well layer 114W3.

The indium composition ratio and the band-gap energy may be the same at the centers of the first well layer 114W1 and the fifth well layer 114W5, and the indium composition ratio and the band-gap energy may be the same at the centers of the second well layer 114W2 and the fourth well layer 114W4, but the present invention is not limited thereto.

In the embodiment, an energy level difference H3 between the first barrier layer 114B1 and the center of the second well layer 114W2 may be greater than an energy level difference H1 between the first barrier layer 114B1 and the center of the first well layer 114W1, and an energy level difference H5 between the first barrier layer 114B1 and the center of the third well layer 114W3 may be greater than the energy level difference H3 between the first barrier layer 114B1 and the center of the second well layer 114W2.

That is, the energy level difference H3 between the first barrier layer 114B1 and the center of the second well layer 114W2 may be greater than the energy level difference H1 between the first barrier layer 114B 1 and the center of the first well layer 114W1, and the energy level difference H5 between the first barrier layer 114B1 and the center of the third well layer 114W3 may be greater than the energy level difference H3 between the first barrier layer 114B1 and the center of the second well layer 114W2. Accordingly, the well layer may be formed in a stepped shape, thereby increasing the carrier-trap efficiency.

In the embodiment, the energy level difference H1 between the first barrier layer 114B1 and the center of the first well layer 114W1 may be greater than an energy level difference H2 between the first barrier layer 114B1 and the first protrusion part SP1, and the energy level difference H3 between the first barrier layer 114B1 and the center of the second well layer 114W2 may be greater than an energy level difference H4 between the first barrier layer 114B1 and the second protrusion part SP2.

That is, the energy level difference H1 between the first barrier layer 114B1 and the center of the first well layer 114W1 may be greater than the energy level difference H2 between the first barrier layer 114B1 and the first protrusion part SP1, and the energy level difference H3 between the first barrier layer 114B1 and the center of the second well layer 114W2 may be greater than the energy level difference H4 between the first barrier layer 114B 1 and the second protrusion part SP2. Accordingly, the energy of the electrons passing through the first protrusion part SP1 and the second protrusion part SP2 may be reduced, thereby increasing the carrier-trap efficiency.

In the embodiment, a width of the well layer 114W may be 3.0 nm or more and 3.5 nm or less, a width of the first barrier layer 114B1 may be 4.5 nm or more and 5.5 nm or less, and a width of the first well layer 114W1 may be 0.6 nm or more and 0.7 nm or less, but the present invention is not limited thereto.

The substrate 105 may be formed of a material having superior thermal conductivity, and may be a conductive substrate or an insulating substrate. For example, at least one of sapphire ($Al_2O_3$), SiC, Si, GaAs, GaN, ZnO, GaP, InP, Ge, and $Ga_2O_3$ may be used as the substrate 105. A concave-convex structure may be formed on the substrate 105, and the cross-section of the concave-convex structure may be a circular, elliptical or polygonal shape, but the present is not limited thereto.

At this point, a buffer layer (not shown) may be formed on the substrate 105. The buffer layer may relieve a lattice mismatch between a material of the light emitting structure to be formed subsequently and the substrate 105, and the material of the buffer layer may include at least one of Group III-V compound semiconductors such as GaN, InN, AlN, InGaN, AlGaN, InAlGaN, and AlInN.

The first conductive semiconductor layer 112 may be disposed on the substrate 105. The first conductive semiconductor layer 112 is formed of Group III-V compound semiconductors doped with a first conductive dopant, and the first conductive semiconductor layer 112 includes a composition formula of $In_xAl_yGa_{1-x-y}N$ ($0 \leq x \leq 1$, $0 \leq y \leq 1$, $0 \leq x+y \leq 1$). For example, the first conductive semiconductor layer 112 may include a structure of stacking layers including at least one of compound semiconductors such as GaN, InN, AlN, InGaN, AlGaN, InAlGaN, AlInN, AlGaAs, GaP, GaAs, GaAsP, and AlGaInP. The first conductive semiconductor layer 112 is an n-type semiconductor layer, and the first conductive dopant includes Si, Ge, Sn, Se, and Te as an n-type dopant. An electrode may be further disposed on the first conductive semiconductor layer 112.

The second conductive semiconductor layer 116 includes a semiconductor doped with a second conductive dopant such as a composition formula of $In_xAl_yGa_{1-x-y}N$ ($0 \leq x \leq 1$, $0 \leq y \leq 1$, $0 \leq x+y \leq 1$). The second conductive semiconductor layer 116 may be formed of any one of compound semiconductors such as GaN, InN, AlN, InGaN, AlGaN, InAlGaN, AlInN, AlGaAs, GaP, GaAs, GaAsP, and AlGaInP. The second conductive semiconductor layer 116 is a p-type semiconductor layer, and the second conductive dopant may include Mg, Zn, Ca, Sr, and Ba as a p-type dopant.

The second conductive semiconductor layer 116 may include a superlattice structure, and the superlattice structure may include an InGaN/GaN superlattice structure or an AlGaN/GaN superlattice structure. The superlattice structure of the second conductive semiconductor layer 116 may diffuse a current included in the voltage abnormally, and thus the active layer can be protected.

The first electrode 120 may be disposed on the first conductive semiconductor layer 112. The first electrode 120 may be formed of at least any one selected from Cr, V, W, Ti, Zn, Ni, Cu, Al, Au, Mo, Ti/Au/Ti/Pt/Au, Ni/Au/Ti/Pt/Au, Cr/Al/Ni/Cu/Ni/Au or the like.

The second electrode 130 may be disposed on the second conductive semiconductor layer 116 and may be connected to an external power supply to provide power to the light emitting structure 110. The second electrode 130 may be formed of at least any one selected from Cr, V, W, Ti, Zn, Ni, Cu, Al, Au, Mo, Ti/Au/Ti/Pt/Au, Ni/Au/Ti/Pt/Au, Cr/Al/Ni/Cu/Ni/Au or the like.

Figure 3:
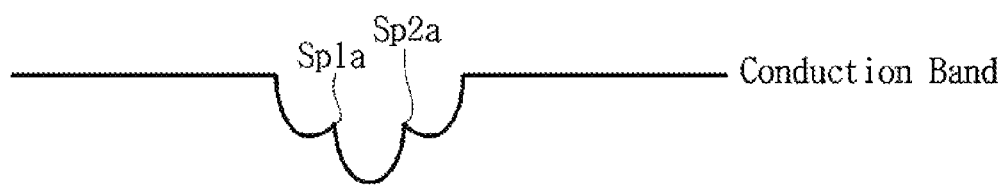
FIG. 3 is an energy-band diagram of an active layer in a light emitting diode according to another embodiment.
Figure 3:
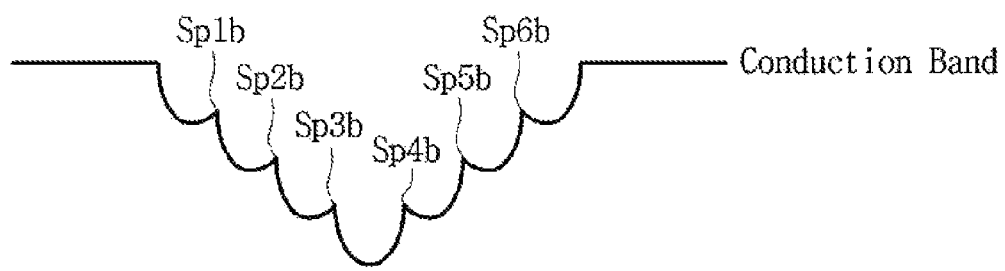

FIG. 3 is an energy-band diagram of an active layer in a light emitting diode according to another embodiment.

Referring to (a) of FIG. 3, an active layer 114A according to the embodiment of (a) of FIG. 3 may include a first protrusion part SP1A and a second protrusion part SP2A unlike the embodiment of FIG. 2, and the first protrusion part SP1A and the second protrusion part SP2A may have the same indium composition ratio and band-gap energy, but the present invention is not limited thereto.

Referring to (b) of FIG. 3, an active layer 114B according to the embodiment of (b) of FIG. 3, unlike the embodiment of FIG. 2, may include a first protrusion part SP1B, a second protrusion part SP2B, a third protrusion part SP3B, a fourth protrusion part SP4B, a fifth protrusion part SP5B, and a sixth protrusion part SP6B. The first protrusion part SP1B and the sixth protrusion part SP6B may have the same indium composition ratio and band-gap energy, the second protrusion part SP2B and the fifth protrusion part SP5B may have the same indium composition ratio and band-gap energy, and the third protrusion part SP3B and the fourth protrusion part SP4B may have the same indium composition ratio and band-gap energy, but the present invention is not limited thereto.

That is, in the light emitting diode according to the embodiment, the energy of electrons moving in the quantum barrier layer may be reduced by the well layer including a plurality of well layers having different indium composition ratios and a plurality of protrusion parts, and thus carrier over-shooting can be prevented.

Figure 4:
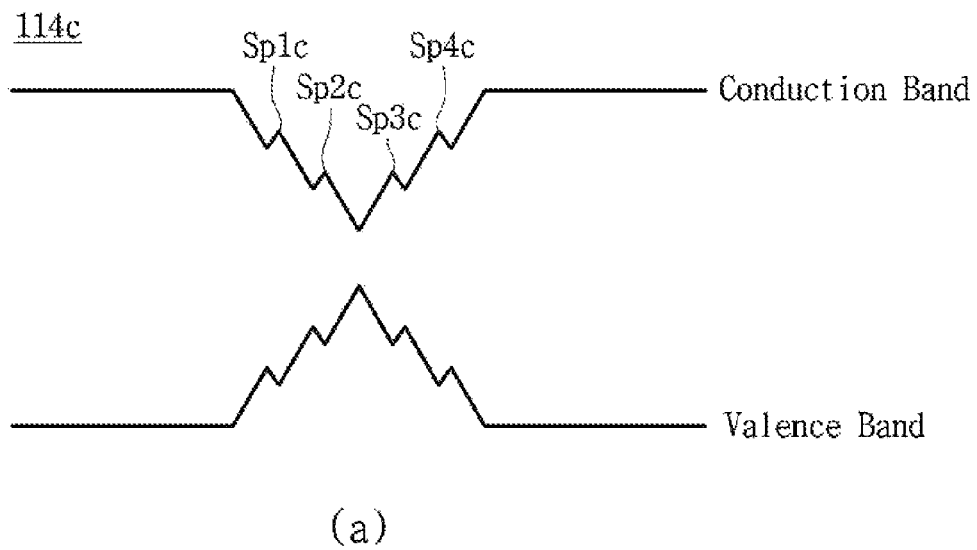
FIG. 4 is an energy-band diagram of an active layer in a light emitting diode according to still another embodiment.
Figure 4:
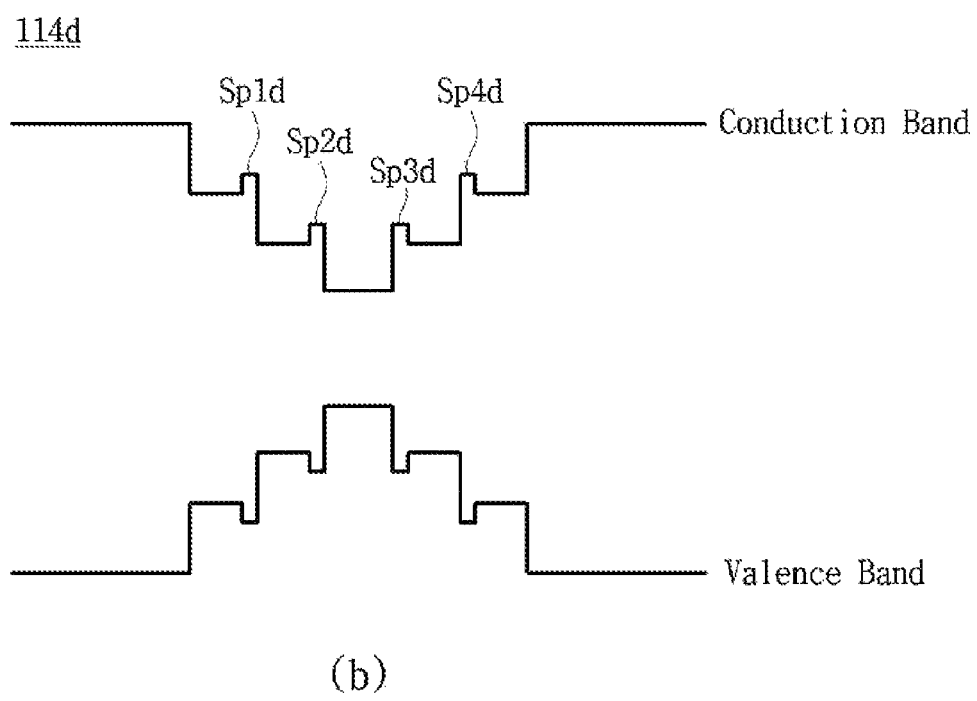

FIG. 4 is an energy-band diagram of an active layer in a light emitting diode according to still another embodiment.

Referring to (a) of FIG. 4, an active layer 114C according to the embodiment of (a) of FIG. 4 may have a straight-line shape rather than a curved-line shape of the embodiment of FIG. 2. The active layer 114C may include a first protrusion part SP1C, a second protrusion part SP2C, a third protrusion part SP3C, and a fourth protrusion part SP4C. The first protrusion part SP1C and the fourth protrusion part SP4C may have the same indium composition ratio and band-gap energy, and the second protrusion part SP2C and the third protrusion part SP3C may have the same indium composition ratio and band-gap energy, but the present invention is not limited thereto.

Referring to (b) of FIG. 4, an active layer 114D according to the embodiment of (b) of FIG. 4 may have a stepped shape rather than a curved shape of the embodiment of FIG. 2. The active layer 114D may include a first protrusion part SP1D, a second protrusion part SP2D, a third protrusion part SP3D, and a fourth protrusion part SP4D. The first protrusion part SP1D and the fourth protrusion part SP4D may have the same indium composition ratio and band-gap energy, and the second protrusion part SP2D and the third protrusion part SP3D may have the same indium composition ratio and band-gap energy, but the present invention is not limited thereto.

That is, in the light emitting diode according to the embodiment, the energy of electrons moving in the quantum barrier layer may be reduced by the well layer including a plurality of well layers having different indium composition ratios and a plurality of protrusion parts, and thus carrier over-shooting can be prevented.

Figure 5:
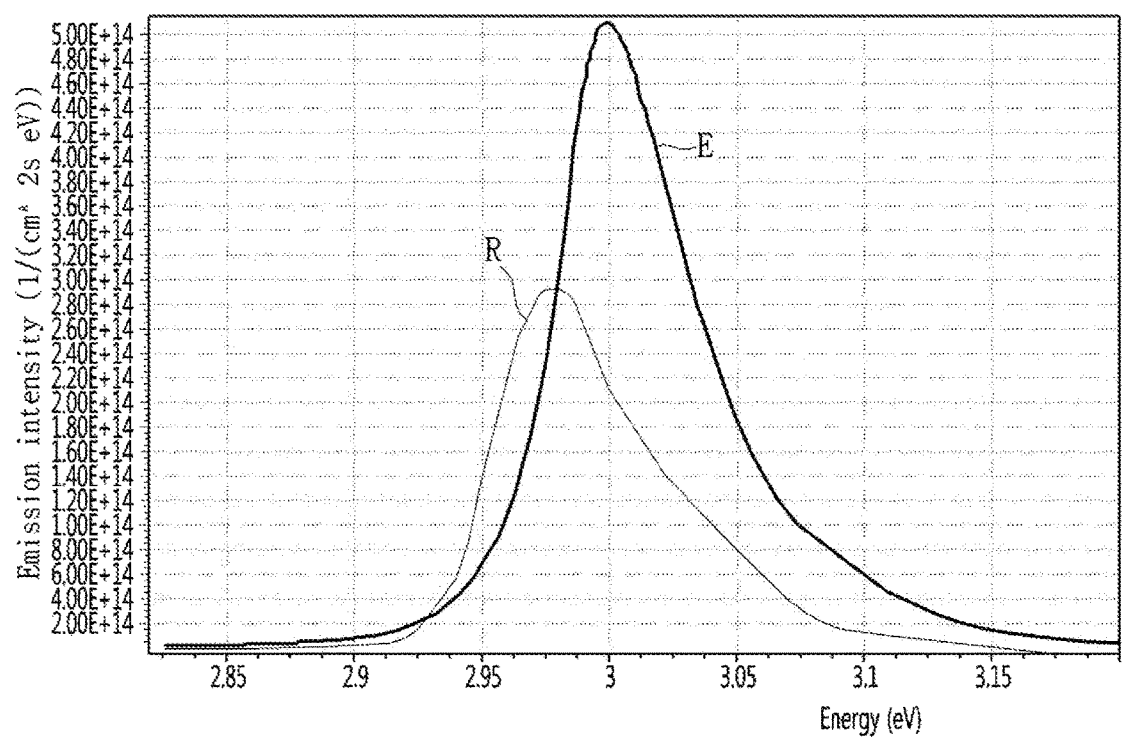
FIG. 5 is a graph illustrating light emission intensity of a light emitting diode according to an embodiment.

FIG. 5 is a graph illustrating light emission intensity of a light emitting diode according to an embodiment.

Referring to FIG. 5, R is a graph illustrating light emission intensity with respect to the energy of the light emitting diode according to the related art, and E is a graph illustrating light emission intensity with respect to the energy of the light emitting diode according to the embodiment.

As compared with the related art, when the light emitting diode according to the embodiment including the well layer of a new structure proposed in the present invention has the energy of 3 eV, it may be seen that the light emission intensity is increased from 2.0 $E^{14}$ (1/(cm$^2$seV)) to 5.0 $E^{14}$ (1/(cm$^2$seV)).

Figure 6:
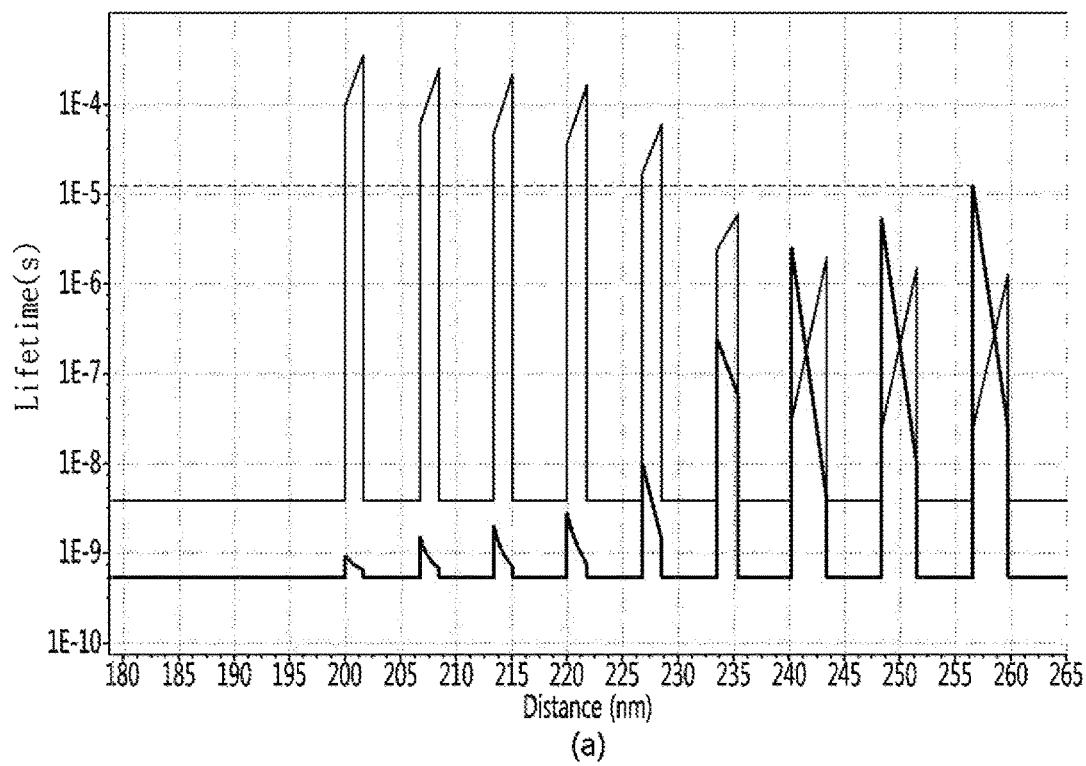
FIG. 6 is a graph illustrating a lifetime of a light emitting diode according to an embodiment.
Figure 6:
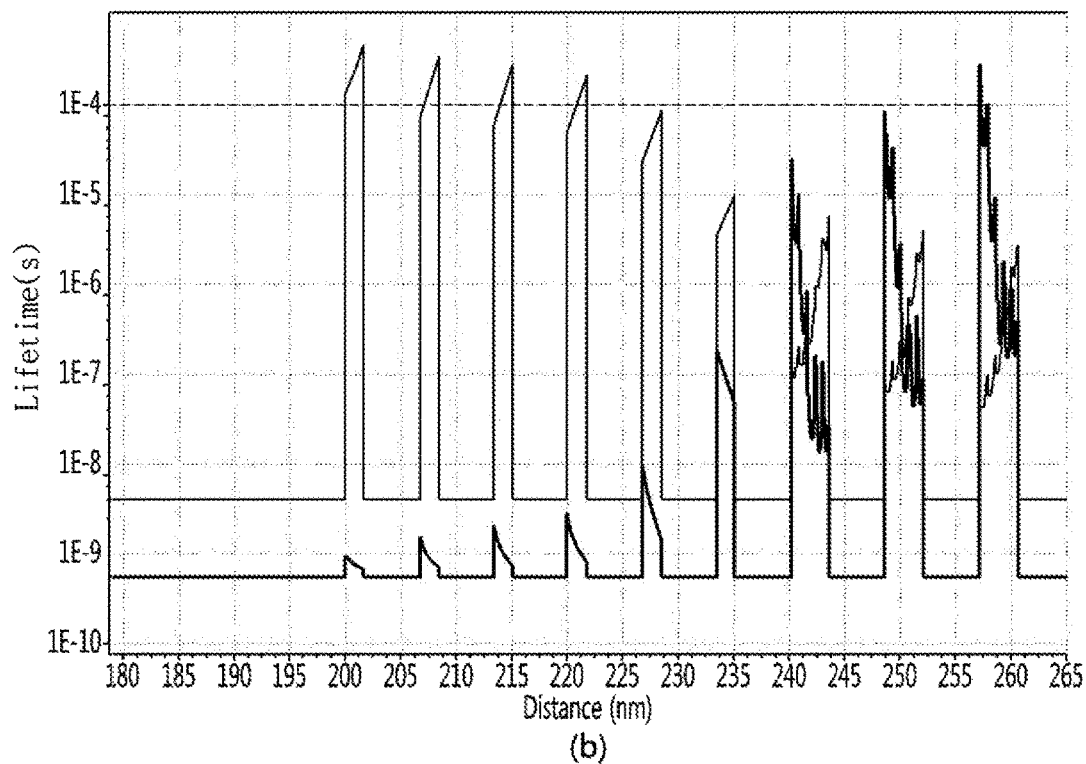

FIG. 6 is a graph illustrating a lifetime of a light emitting diode according to an embodiment.

(a) of FIG. 6 is a graph illustrating a lifetime of a light emitting diode in the related art, and (b) of FIG. 6 is a graph illustrating a lifetime of a light emitting diode according to the embodiment.

Referring to (a) and (b) of FIG. 6, it may be seen that the lifetime of the light emitting diode according to the embodiment including the well layer of the new structure proposed in the present invention is increased from 1 $E^{-5}$(s) to 1 $E^{-4}$(s) as compared with the related art.

Figure 7:
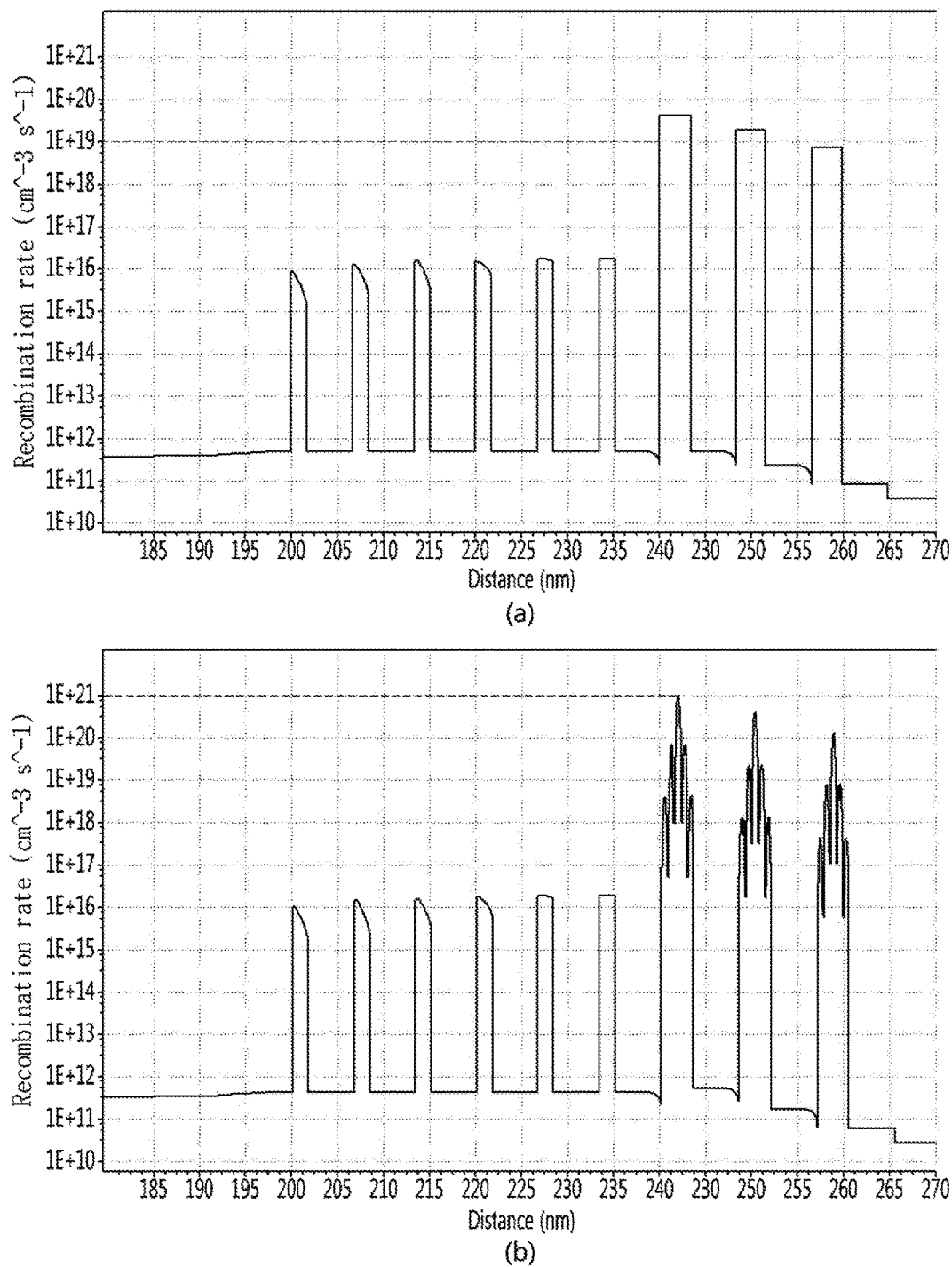
FIG. 7 is a graph illustrating a recombination rate of a light emitting diode according to an embodiment.

FIG. 7 is a graph illustrating a recombination rate of a light emitting diode according to an embodiment.

(a) of FIG. 7 is a graph illustrating a recombination rate of a light emitting diode in the related art, and (b) of FIG. 7 is a graph illustrating a recombination rate of a light emitting diode according to the embodiment.

Referring to (a) and (b) of FIG. 7, it may be seen that the recombination rate of the light emitting diode according to the embodiment including the well layer of the new structure proposed in the present invention is increased from 1 $E^{19}$(cm$^{-3}$s$^{-1}$) to 1 $E^{21}$(cm$^{-3}$s$^{-1}$) as compared with the related art.

Figure 8:
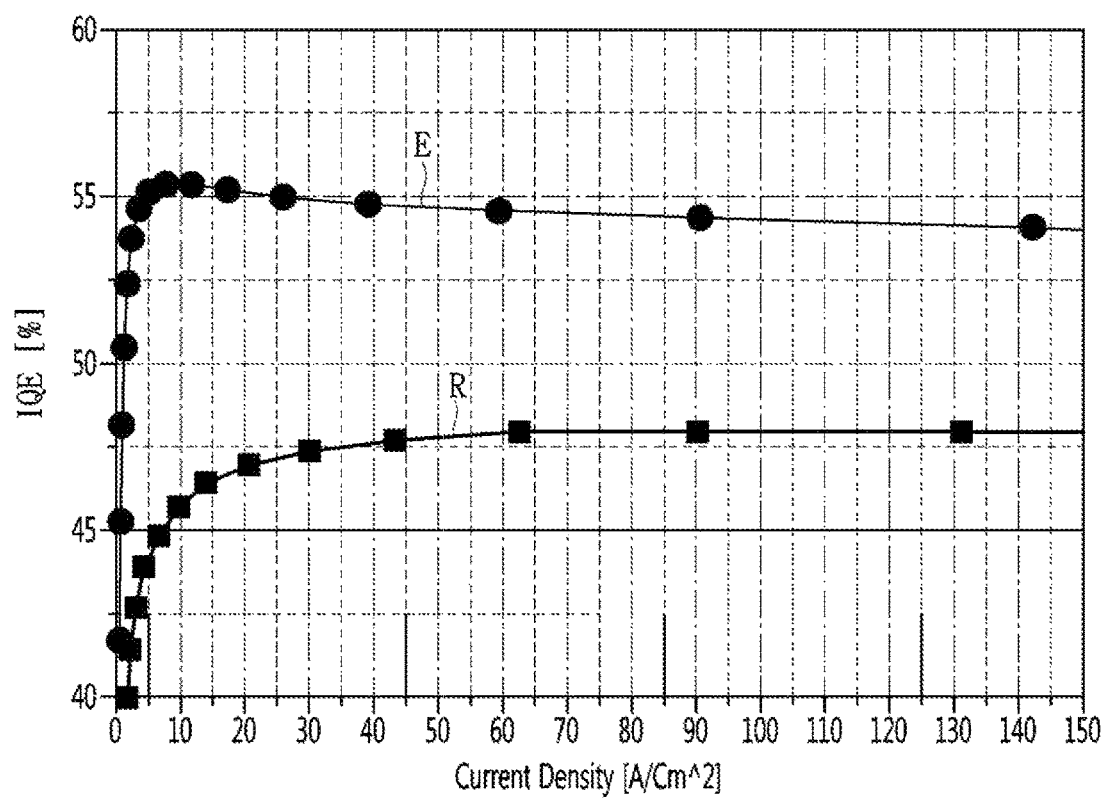
FIG. 8 is a graph illustrating internal quantum efficiency of a light emitting diode according to an embodiment.

FIG. 8 is a graph illustrating internal quantum efficiency of a light emitting diode according to an embodiment.

Referring to FIG. 8, R is a graph illustrating internal quantum efficiency of the light emitting diode according to the related art, and E is a graph illustrating internal quantum efficiency of the light emitting diode according to the embodiment.

As compared with the related art, when the light emitting diode according to the embodiment including the well layer of the new structure proposed in the present invention has the current density of 70 (A/Cm$^2$), it may be seen that the internal quantum efficiency of the embodiment is 54%, and the internal quantum efficiency of the related art is 46%, which is increased by 8%.

Figure 9:
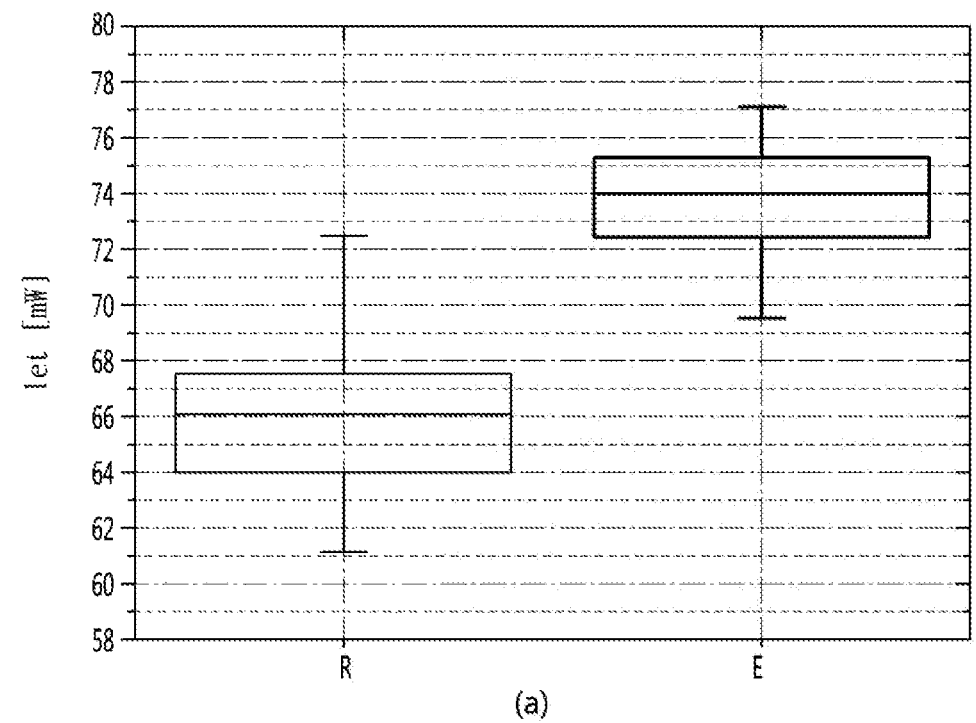
FIG. 9 is a graph illustrating luminous intensity of a light emitting diode according to an embodiment.
Figure 9:
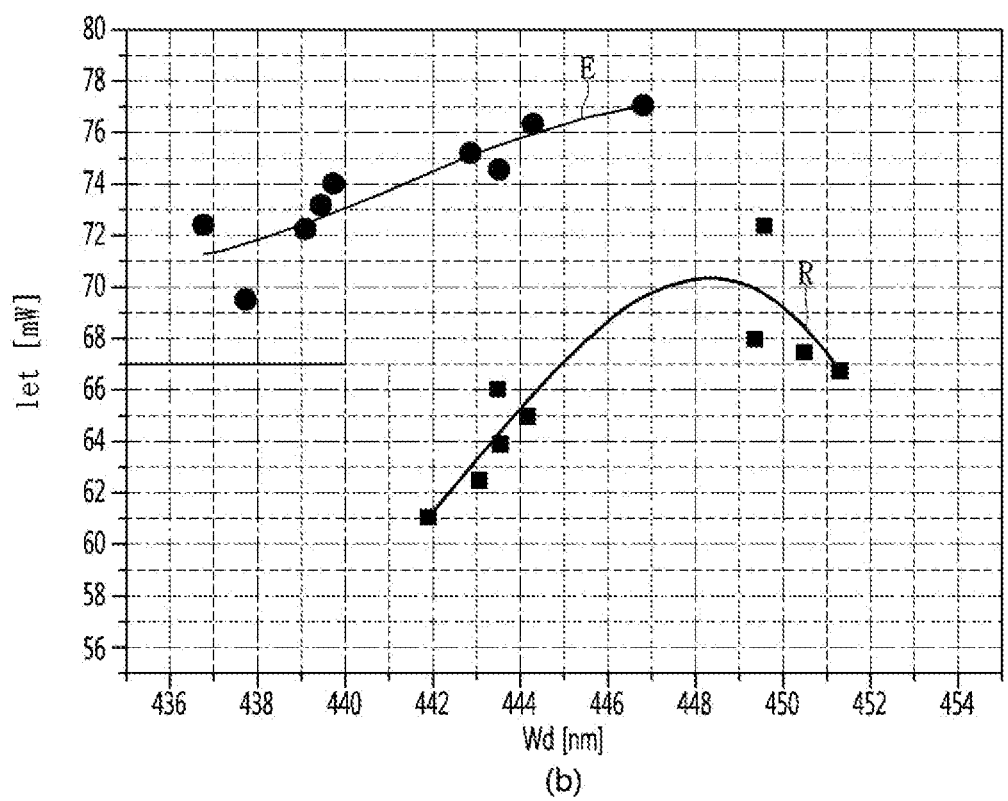

FIG. 9 is a graph illustrating luminous intensity of a light emitting diode according to an embodiment.

(a) of FIG. 9 is a box plot illustrating a comparison of the luminous intensities (let) of the light emitting diodes according to the related art and the embodiment, and it may be seen that the luminous intensity of the light emitting diode according to the embodiment is increased by 8 mW as compared with the related art.

Referring to (b) of FIG. 9, which is a graph illustrating a comparison of the luminous intensities (let) with respect to the wavelengths of the light emitting diodes according to the related art and the embodiment, as compared with the related art, it may be seen that the luminous intensity (let) of the light emitting diode according to the embodiment is higher in the emitting region, for example, in the wavelength range of 436 nm to 446 nm.

Figure 10:
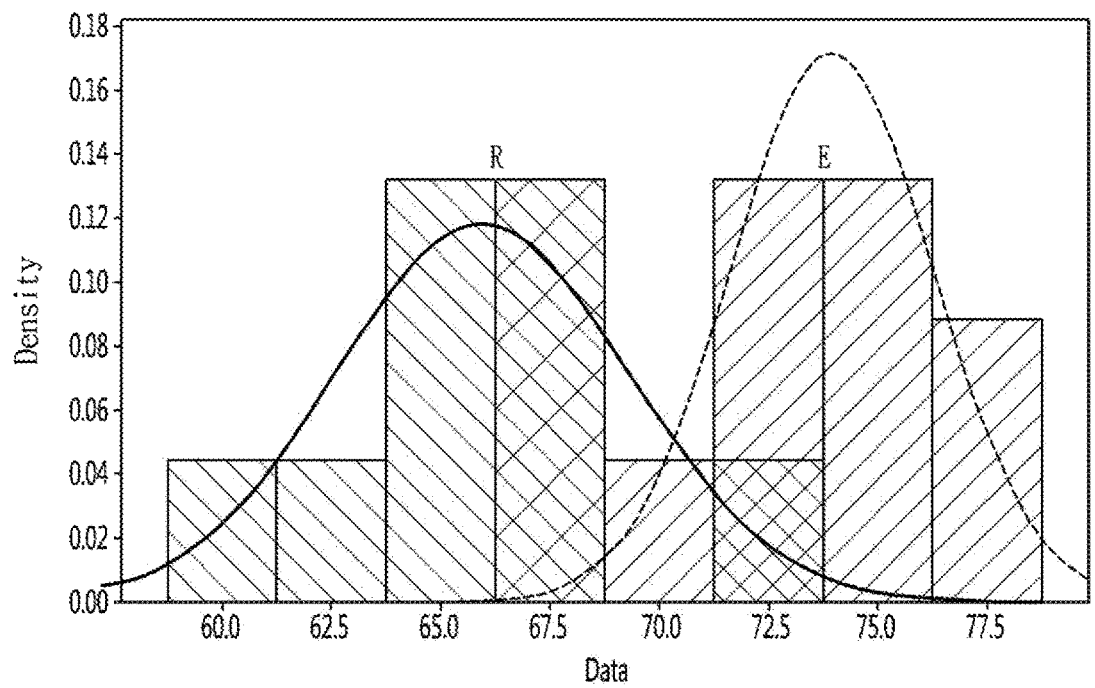
FIG. 10 is a histogram of luminous intensity data and density of a light emitting diode according to an embodiment.

FIG. 10 is a histogram of luminous intensity data and density of a light emitting diode according to an embodiment.

Referring to FIG. 10, R is the histogram obtained by converting the density of luminous intensity of the light emitting diode according to the related art into a normal distribution, and E is the histogram obtained by converting the density of luminous intensity of the light emitting diode according to the embodiment into a normal distribution.

As compared with the related art, it may be seen that the luminous intensity and density of the light emitting diode according to the embodiment including the well layer of the new structure proposed in the present invention are increased.

Figure 11:
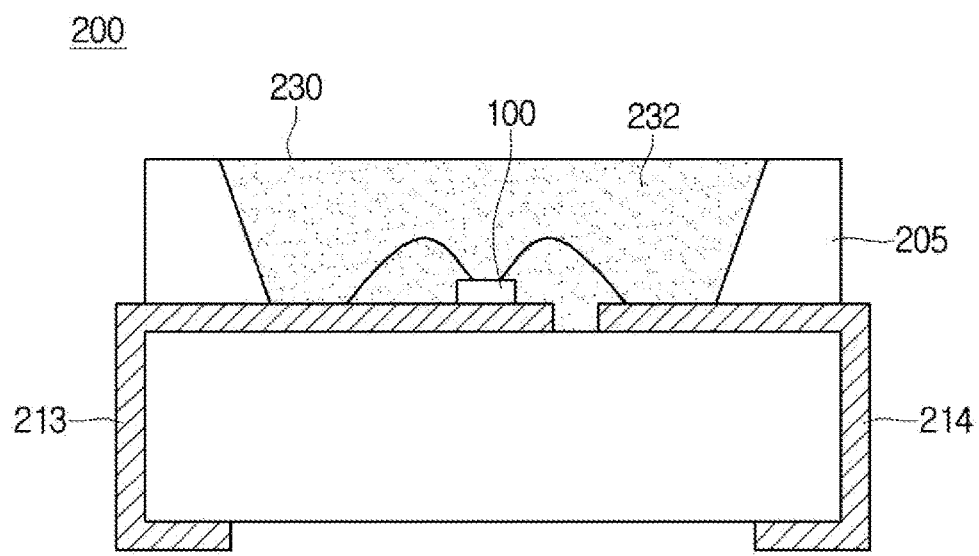
FIG. 11 is a sectional view of a light emitting diode package according to an embodiment.

FIG. 11 is a sectional view of a light emitting diode package according to an embodiment.

The light emitting diode package according to the invention can have the light emitting diode having structure described above.

The light emitting diode package 200 includes a package body part 205, a third electrode layer 213 and a fourth electrode layer 214, which are disposed on the package body part 205, a light emitting diode 100 disposed on the package body part 205 to be electrically connected to the third electrode layer 213 and the fourth electrode layer 214, and a molding member 230 surrounding the light emitting diode 100.

The package body part 205 may be formed of a silicon material, a synthetic resin, or a metal material, and an inclined surface may be formed around the light emitting diode 100.

The third electrode layer 213 and the fourth electrode layer 214 are electrically separated from each other, and supply power to the light emitting diode 100. Also, the third electrode layer 213 and the fourth electrode layer 214 may reflect light generated in the light emitting diode 100 to improve light efficiency. The third electrode layer 213 and the fourth electrode layer 214 may release heat generated in the light emitting diode 100 to the outside.

The light emitting diode 100 may be disposed on the package body part 205 or be disposed on the third electrode layer 213 or the fourth electrode layer 214.

The light emitting diode 100 may be electrically connected to the third electrode layer 213 and/or the fourth electrode layer 214 using any one of a wire-bonding method, a flip-chip method, and a die bonding method. In the embodiment, it is illustrated that the light emitting diode 100 is electrically connected to each of the third electrode layer 213 and the fourth electrode layer 214 through a wire, but the present invention is not limited thereto.

The molding member 240 may surround the light emitting diode 100 to protect the light emitting diode 100. Also, the molding member 240 may include a phosphor 232 to vary the wavelength of light emitted from the light emitting diode 100.

Figure 12:
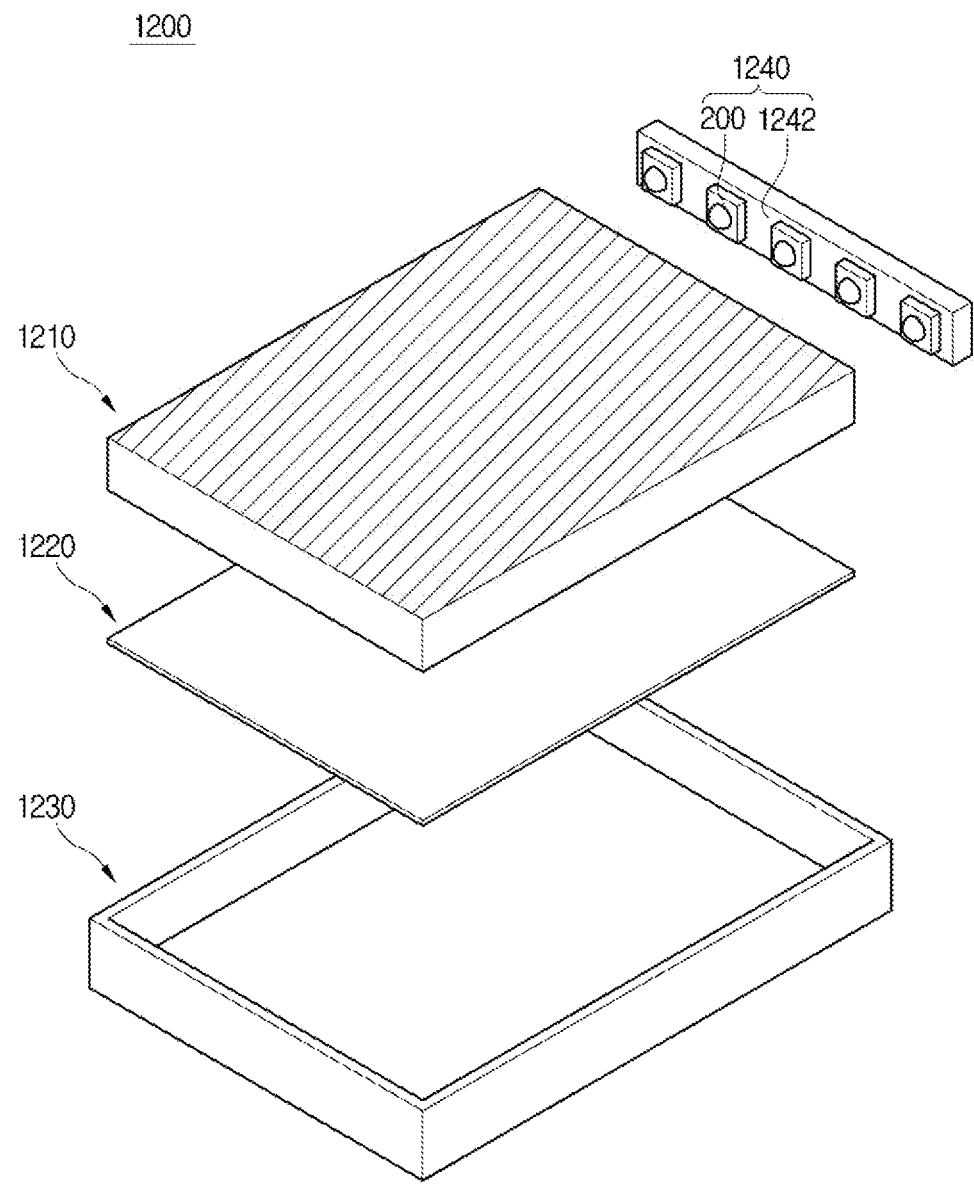
FIGS. 12 and 13 are exploded perspective views showing embodiments of a lighting system including the light emitting diode package according to the embodiment.
Figure 13:
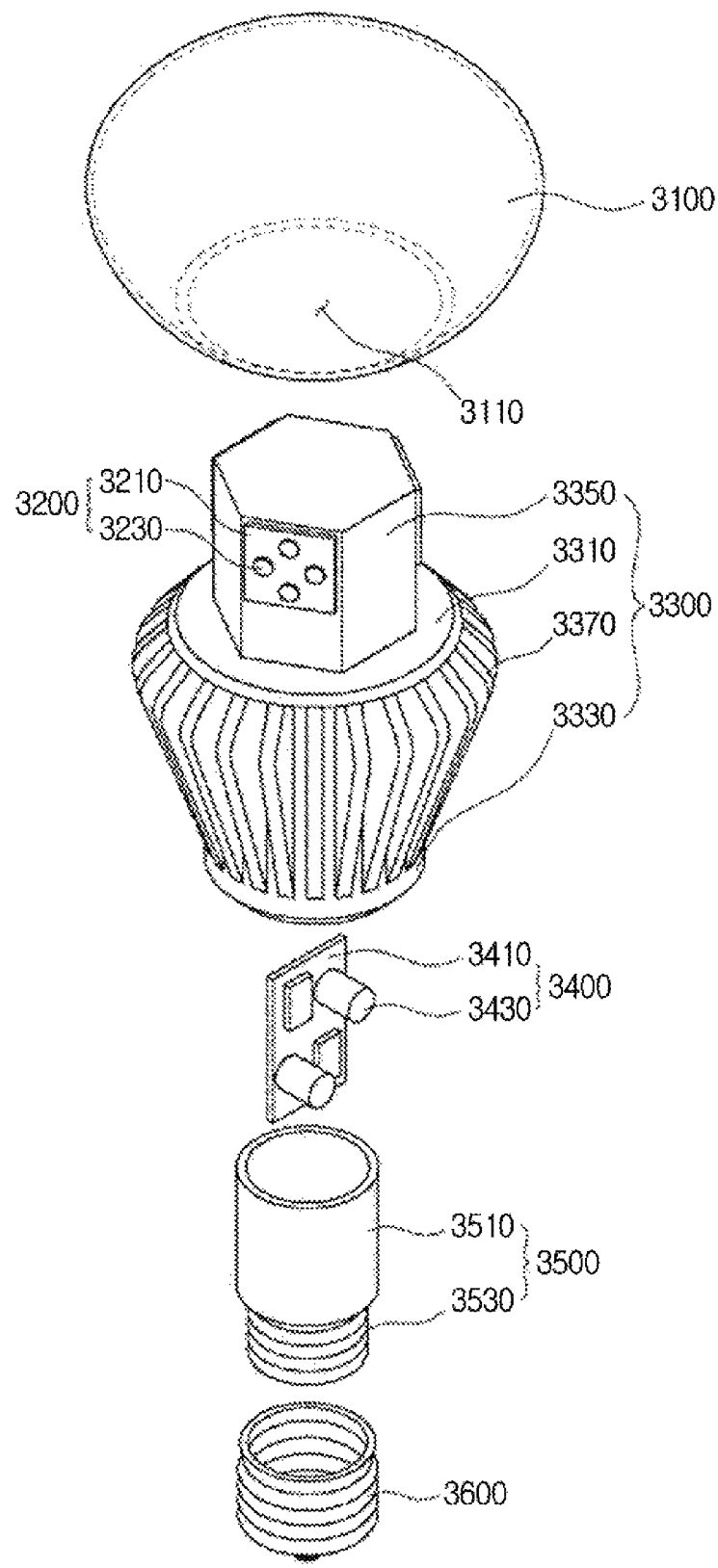

FIGS. 12 and 13 are views showing lighting systems according to embodiments.

As shown in FIG. 12, a lighting system according to an embodiment may include a cover 2100, a light source module 2200, a radiator 2400, a power supply part 2600, an inner case 2700, and a socket 2800. Also, the lighting system according to the embodiment may further include at least one of a member 2300 and a holder 2500. The light source module 2200 may include the light emitting diode 100 or the light emitting diode package 200 according to the present invention.

For example, the cover 2100 may have a blub shape or a hemispherical shape, and be provided in a partially-open hollow shape. The cover 2100 may be optically coupled to the light source module 2200. For example, the cover 2100 may diffuse, scatter, or excite light provided from the light source module 2200. The cover 2100 may be a type of optical member. The cover 2100 may be coupled to the radiator 2400. The cover 2100 may include a coupling part coupled to the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200 to be emitted to the outside.

The material of the cover 2100 may include glass, plastic, polypropylene (PP), polyethylene (PE), polycarbonate (PC), and the like. Here, the polycarbonate (PC) has the superior light resistance, heat resistance and strength. The cover 2100 may be transparent such that the light source module 2200 is viewed from the outside, or be opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source part 2210, a connection plate 2230, and a connector 2250.

The member 2300 is disposed at a top surface of the radiator 2400, and includes guide grooves 2310 into which a plurality of light sources parts 2210 and the connector 2250 are inserted. The guide grooves 2310 correspond to a substrate of the light source part 2210 and the connector 2250.

A surface of the member 2300 may be applied or coated with a light reflective material. For example, the surface of the member 2300 may be applied or coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment can be improved.

For example, the member 2300 may include an insulating material. The connection plate 2230 of the light source module 2200 may include an electrically conductive material. Accordingly, the radiator 2400 can be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of the inner case 2700. Accordingly, the power supply part 2600 received in the insulating part 2710 of the inner case 2700 is closed. The holder 2500 includes a guide protrusion part 2510. The guide protrusion part 2510 has a hole through which a protrusion part 2610 of the power supply part 2600 passes.

The power supply part 2600 processes or converts an electric signal received from the outside and provides the processed or converted electric signal to the light source module 2200. The power supply part 2600 is received in the receiving groove 2719 of the inner case 2700, and is closed inside the inner case 2700 by the holder 2500.

The power supply part 2600 may include the protrusion part 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the present invention is not limited thereto.

The extension part 2670 has a shape protruding from an opposite side of the base 2650 to the outside. The extension part 2670 is inserted into the inside of a connection part 2750 of the inner case 2700, and receives an electric signal from the outside. For example, the extension part 2670 may have a width smaller than or equal to that of the connection part 2750 of the inner case 2700. One terminals of a "+electric wire" and a "−electric wire" are electrically connected to the extension part 2670, and the other terminals of the "+electric wire" and the "−electric wire" may be electrically connected to the socket 2800.

The inner case 2700 may include a molding part therein together with the power supply part 2600. The molding part is prepared by hardening molding liquid, and the power supply part 2600 may be fixed inside the inner case 2700 by the molding part.

As shown in FIG. 13, a lighting system according to an embodiment may include a cover 3100, a light source part 3200, a radiator 3300, a circuit part 3400, an inner case 3500, and a socket 3600. The light source part 3200 may include the light emitting diode or the light emitting device module according to the present invention.

The cover 3100 may have a blub shape and is hollow. The cover 3100 has an opening 3110. The light source part 3200 and a member 3350 may be inserted through the opening 3110.

The cover 3100 may be coupled to the radiator 3300, and surround the light source part 3200 and the member 3350. The light source part 3200 and the member 3350 may be blocked from the outside by the coupling between the cover 3100 and the radiator 3300. The cover 3100 may be coupled to the radiator 3300 by an adhesive or various schemes such as a rotation coupling scheme and a hook coupling scheme. The rotation coupling scheme is a scheme where a thread of the cover 3100 is coupled to a screw groove of the radiator 3300, and the cover 3100 is coupled to the radiator 3300 by rotation of the cover 3100. The hook coupling scheme is a scheme where a projection of the cover 3100 is inserted into a groove of the radiator 3300 such that the cover 3100 is coupled to the radiator 3300.

The cover 3100 may be optically coupled to the light source part 3200. In detail, the cover 3100 may diffuse, scatter, or excite light provided from a light emitting diode 3230 of the light source part 3200. The cover 3100 may be a type of optical member. Here, the cover 3100 may be provided at an inner/outer surface or an inside thereof with a luminescence material in order to excite the light supplied from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

The material of the cover 3100 may include glass, plastic, polypropylene (PP), polyethylene (PE), polycarbonate (PC), and the like. The polycarbonate (PC) has the superior light resistance, heat resistance and strength. The cover 3100 may be transparent such that the light source module 2200 is viewed from the outside, or be opaque. The cover 3100 may be formed through a blow molding scheme.

The light source part 3200 is disposed at the member 3350 of the radiator 3300, and a plurality of light source parts may be disposed. In detail, the light source part 3200 may be disposed in at least one of a plurality of side surfaces of the member 3350. In addition, a top end of the light source part 3200 may be disposed at the side surface of the member 3350.

The light source part 3200 may be disposed at three of six side surfaces of the member 3350. However, the present invention is not limited thereto, and the light source part 3200 may be disposed at all side surfaces of the member 3350. The light source part 3200 may include a substrate 3210 and the light emitting device 3230. The light emitting device 3230 may be disposed on one surface of the substrate 3210.

The substrate 3210 has a rectangular plate shape, but the present invention is not limited thereto. The substrate 3210 may have various shapes. For example, the substrate 3210 may have a circular plate shape or a polygonal plate shape. The substrate 3210 may be provided by printing a circuit pattern on an insulator. For example, the substrate 3210 may include a typical printed circuit board (PCB), a metal core PCB, a flexible PCB, a ceramic PCB, and the like. In addition, the substrate 3210 may have a COB (chips on board) type in which LED chips, which are not packaged, are directly bonded on the PCB. In addition, the substrate 3210 may include a material to effectively reflect light, or the surface of the substrate may have a color such as a white color or a silver color to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting diode 3230 may include a light emitting diode chip to emit red, green, and blue lights or a light emitting diode chip to emit UV The light emitting diode chip may be of a lateral type or a vertical type. The light emitting diode may emit one of blue, red, yellow, and green lights.

The light emitting diode 3230 may include a luminescence material. The luminescence material may include at least one of garnet-based phosphors (YAG or TAG), silicate-based phosphors, nitride-based phosphors, and oxynitride-based phosphors. Alternatively, the luminescence material may include at least one of a yellow luminescence material, a green luminescence material, and a red luminescence material.

The radiator 3300 is coupled to the cover 3100, and may radiate heat from the light source part 3200. The radiator 330 has a predetermined volume, and includes a top surface 3310 and a side surface 3330. The member 3350 may be disposed on the top surface 3310 of the radiator 3310. The top surface 3310 of the radiator 3300 may be coupled to the cover 3100. The top surface 3310 of the radiator 3300 may have a shape corresponding to the opening 3110 of the cover 3100.

A plurality of heat radiation pins 3370 may be disposed at the side surface 3330 of the radiator 3300. The heat radiation pin 3370 may extend outwards from the side surface 3330 of the radiator 3300, or be connected to the side surface 3330 of the radiator 3300. The heat radiation pin 3370 may improve heat radiation efficiency by increasing a heat radiation area of the radiator 3300. The side surface 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six side surfaces. The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be disposed at the six side surfaces of the member 3350. The light source part 3200 may be disposed at all or some of the six side surfaces of the member 3350. In FIG. 13, the light source part 3200 is disposed at three of the six side surfaces of the member 3350.

The substrate 3210 is disposed at the side surface of the member 3350. The side surface of the member 3350 may be substantially vertical to the top surface 3310 of the radiator 3300. Accordingly, the substrate 3210 and the top surface of the radiator 3300 can be substantially vertical to each other.

The member 3350 may include a material having thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), and tin (Sn). Alternatively, the member 3350 may include a plastic material having thermal conductivity. The plastic material having thermal conductivity is lighter than the metal, and has thermal conductivity in a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and be received in the radiator 3300 together with the inner case 3500. The circuit part 3400 may include a circuit board 3410 and a plurality of components mounted on the circuit board 3410.

The circuit board 3410 has a circular plate shape, but the present invention is not limited thereto. That is, the circuit board 3410 may have various shapes. For example, the circuit board may have an elliptical plate shape or a polygonal plate shape. The circuit board 3410 may be provided by printing a circuit pattern on an insulator.

The circuit board 3410 is electrically connected to the substrate 3210 of the light source part 3200. For example, the circuit part 3410 and the substrate 3210 may be electrically connected to each other by a wire. The wire may be disposed inside the radiator 3300 to connect the substrate 3210 to the circuit board 3410.

For example, a plurality of components 3430 may include a direct current converter converting AC power provided from an external power supply into DC power, a driving chip controlling driving of the light source part 3200, and an electrostatic discharge (ESD) protective device.

The inner case 3500 receives the circuit part 3400 therein. The inner case 3500 may include a receiving part 3510 to receive the circuit part 3400.

For example, the receiving part 3510 may have a cylindrical shape. The shape of the receiving part 3510 may be changed depending on the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled to the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled to the inner case 3500. In detail, the socket 3600 may be coupled to the connecting part 3530 of the inner case 3500. The socket 3600 may have the same structure as that of a conventional incandescent light bulb. The socket 3600 is electrically connected to the circuit part 3400. For example, the circuit part 3400 and the socket 3600 may be connected to each other by a wire. Accordingly, if external power is applied to the socket 3600, the external power can be transferred to the circuit part 3400. The socket 3600 may have a screw groove structure corresponding to a thread structure of the connecting part 3530.

The invention claimed is:

1. A light emitting diode comprising: a substrate; a first conductive semiconductor layer on the substrate; an active layer on the first conductive semiconductor layer; and a light emitting structure, including a second conductive semiconductor layer on the active layer, wherein the active layer comprises at least one quantum well layer and at least one quantum barrier layer, wherein the at least one quantum well layer includes a plurality of well layers having different indium composition ratios and a plurality of protrusion parts having different indium composition ratios, wherein one of the plurality of well layers is disposed at a center portion of the at least one quantum well layer and has the highest indium composition ratio in the at least one quantum well layer, wherein each of the plurality of protrusion parts is disposed between the plurality of well layers, wherein the plurality of protrusion parts has a lower indium composition ratio than that of the one of the plurality of well layers, wherein a band-gap energy of the plurality of protrusion parts is smaller than that of the at least one quantum barrier layer, wherein the plurality of protrusion parts are a region of a band-gap energy of the at least one quantum well layer.

2. The light emitting diode of claim 1, wherein the plurality of well layers comprises a first well layer, a second well layer having a different indium composition ratio from that of the first well layer on the first well layer, and
   wherein the plurality of protrusion parts comprises a first protrusion part between the first well layer and the second well layer.

3. The light emitting diode of claim 2, wherein an indium composition ratio of the first well layer is lower than that of the second well layer and an indium composition ratio of the first protrusion part is lower than that of the second well layer.

4. The light emitting diode of claim 2, wherein band-gap energy of the first well layer is greater than that of the second well layer, and band-gap energy of the first protrusion part is greater than that of the second well layer.

5. The light emitting diode of claim 2, wherein the plurality of well layers comprises a third well layer on the second well layer, and
   wherein the plurality of protrusion parts comprises a second protrusion part between the second well layer and the third well layer,
   wherein the third well layer is disposed at the center portion of the quantum well layer.

6. The light emitting diode of claim 5, wherein the indium composition ratio of the second well layer is lower than that of the third well layer, and an indium composition ratio of the second protrusion part is lower than that of the third well layer.

7. The light emitting diode of claim 5, wherein band-gap energy of the second well layer is greater than that of the third well layer, and band-gap energy of the second protrusion part is greater than that of the third well layer.

8. The light emitting diode of claim 5, wherein an indium composition ratio of the first protrusion part is lower than that of the second protrusion part.

9. The light emitting diode of claim 2, wherein the first well layer is $In_xGa_{1-x}N$, and the indium composition ratio X at the center of the first well layer is 0.06 or more and 0.065 or less.

10. The light emitting diode of claim 2, wherein the second well layer is $In_yGa_{1-y}N$, and the indium composition ratio Y at the center of the second well layer is 0.12 or more and 0.13 or less.

11. The light emitting diode of claim 5, wherein the third well layer is $In_zGa_{1-z}N$, and the indium composition ratio Z at the center of the third well layer is 0.17 or more and 0.19 or less.

12. The light emitting diode of claim 2, wherein the first protrusion part is $In_qGa_{1-q}N$, and the indium composition ratio Q of the first protrusion part is 0.03 or more and 0.05 or less.

13. The light emitting diode of claim 5, wherein the second protrusion part is $In_wGa_{1-w}N$, and the indium composition ratio W of the second protrusion part is 0.09 or more and 0.11 or less.

14. A lighting system comprising the light emitting diode of claim 1.

15. A light emitting diode comprising: a substrate; a first conductive semiconductor layer on the substrate; an active layer on the first conductive semiconductor layer; and a light emitting structure, including a second conductive semiconductor layer on the active layer, wherein the active layer comprises at least one quantum well layer and at least one quantum barrier layer, wherein the at least one quantum well layer comprises a first well layer adjacent to the quantum barrier layer, a second well layer, and a third well layer having different indium composition ratios, the second well layer is disposed between the first well layer and the third well layer, wherein the at least one quantum well layer comprises a first protrusion part between the first well layer and the second well layer, and a second protrusion part between the second well layer and the third well layer, wherein an indium composition ratio of the second protrusion part is greater than that of the first protrusion part, wherein a width of the at least one quantum well layer is 3.0 nm or more and 3.5 nm or less, a width of the at least one quantum barrier layer is 4.5 nm or more and 5.5 nm or less, and a width of the first well layer is 0.6 nm or more and 0.7 nm or less, wherein the first and second protrusion parts are a region of a band-gap energy of the at least one quantum well layer.

16. The light emitting diode of claim 15, wherein a indium composition ratio of the first well layer is lower than that of the second well layer, the indium composition ratio of the second well layer is lower than that of the third well layer, and an indium composition ratio of the first protrusion part is lower than that of the second protrusion part.

17. A light emitting diode comprising: a first conductive semiconductor layer; a second conductive semiconductor layer on the first conductive semiconductor layer; an active layer between the first conductive semiconductor layer and the second conductive semiconductor layer, wherein the active layer comprises a first quantum barrier layer, a second quantum barrier layer on the first quantum barrier layer, and a quantum well layer between the first quantum barrier layer and the second quantum barrier layer, wherein the quantum well layer includes a plurality of well layers and a plurality of protrusion parts, wherein the plurality of well layers and the plurality of protrusion parts include an InGaN semiconductor and have a smaller band-gap energy than a band-gap energy of the first and second quantum barrier layers, wherein each of the plurality of protrusion parts is disposed between the plurality of well layers, wherein one of plurality of well layers is disposed at a center portion of the quantum well layer, wherein each of the plurality of protrusion parts has a lower indium composition ratio than that of the plurality of well layers, wherein a band-gap energy of each of the plurality of protrusion parts is smaller than that of the quantum barrier layer, wherein the plurality of protrusion parts are a region of a band-gap energy of the quantum well layer.

18. The light emitting diode of claim 17, wherein the plurality of protrusion parts includes a first protrusion part between the first barrier layer and the center portion of the quantum well layer, a second protrusion part between the second barrier layer and the center portion of the quantum well layer, and
wherein the first protrusion part has the same indium composition ratio as the second protrusion part.

19. The light emitting diode of claim 18, wherein the plurality of well layers comprises a first well layer between the first protrusion part and the first quantum barrier layer, a second well layer between the second protrusion part and the second quantum barrier layer, and a third well layer between the first well layer and the second well layer,
wherein an indium composition ratio of a center portion of the second well layer is smaller than an indium composition ration of a center potion of the first well layer,
wherein an indium composition ratio of a center portion of the third well layer is smaller than the indium composition ration of the center potion of the second well layer,
wherein an indium composition ratio of the first protrusion part is smaller than the indium composition ration of the center potion of the first well layer, and
wherein an indium composition ratio of the second protrusion part is smaller than the indium composition ration of the center potion of the second well layer.

20. The light emitting diode of claim 17, wherein the protrusion parts include an upper protrusion parts which has a first indium composition ratio, and a lower protrusion parts which has a second indium composition ratio, and
wherein the second indium composition ration is smaller than the first indium composition ratio.

* * * * *